United States Patent [19]

Bowlds

[11] Patent Number: 4,956,617

[45] Date of Patent: Sep. 11, 1990

[54] MECHANICAL ADJUSTMENT ARRANGEMENT FOR DIELECTRIC RESONATOR OSCILLATOR

[75] Inventor: Daniel P. Bowlds, County of Daviess, Ky.

[73] Assignee: MPD, Inc., Owensbor, Ky.

[21] Appl. No.: 335,766

[22] Filed: Apr. 10, 1989

[51] Int. Cl.$^5$ .......................... H03B 5/18; H03B 7/12; H03B 7/14; H01P 7/10

[52] U.S. Cl. .............................. 331/96; 331/107 DP; 331/117 D; 333/219.1

[58] Field of Search .............. 331/96, 107 DP, 117 D; 333/219.1

[56] References Cited

U.S. PATENT DOCUMENTS 4,591,806 5/1986 Havens .................................. 331/96

FOREIGN PATENT DOCUMENTS 56-138305 10/1981 Japan ..................................... 331/96
59-176905 10/1984 Japan ................................. 333/219.1
60-160704 8/1985 Japan ............................... 331/117 D
60-232705 11/1985 Japan ..................................... 331/96

Primary Examiner—David Mis
Attorney, Agent, or Firm—Warren D. Flackbert

[57] ABSTRACT

An arrangement for mechanically adjusting the oscillation frequency in a dielectric resonator oscillator which includes a base or support member, as a cover for the oscillator housing, involving two rotatable plates between which the aforesaid base is sandwiched. The base includes an opening extending therethrough, where a rotatable first plate overlies such opening on one side of the base, and a rotatable second plate overlies such opening on the opposite side of the base. The first rotatable plate includes an off-center opening adapted to receive a centrally disposed stem portion extending from the second rotatable plate, where a dielectric resonator is disposed off-center on the second rotatable plate and extends in an opposite direction to that of the stem portion. A fastening member encircles the stem portion and maintains the assembled rotatable first plate and rotatable second plate at a selected X and Y coordinate location. The oscillation frequency at such a coordinate location is fixed irrespective of any movement of the base.

8 Claims, 1 Drawing Sheet

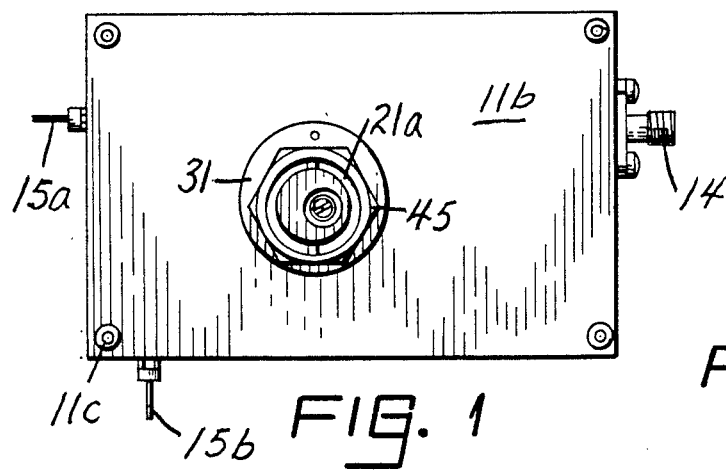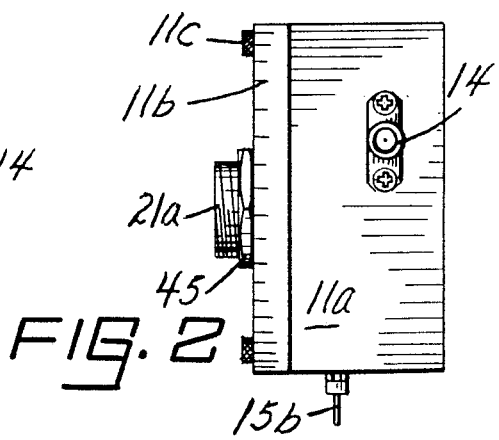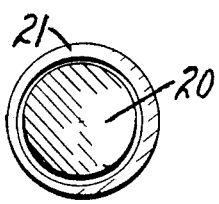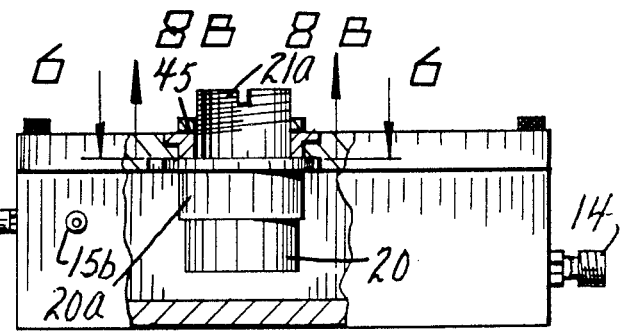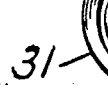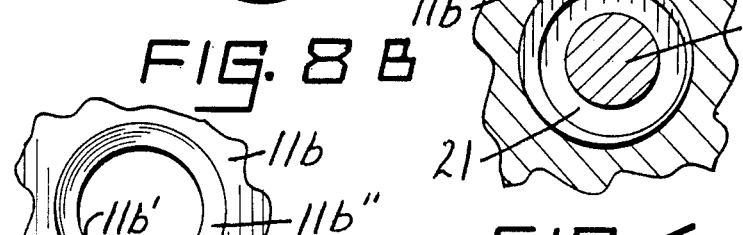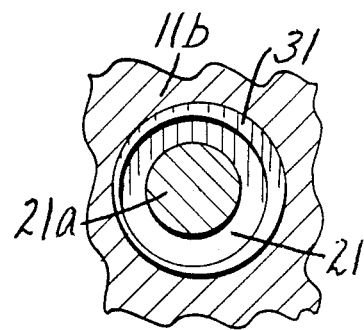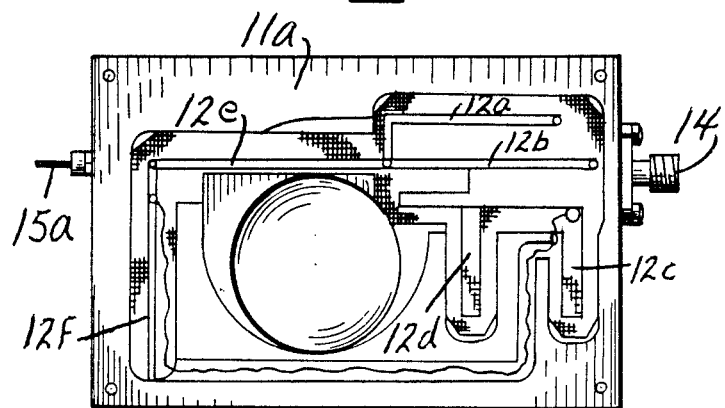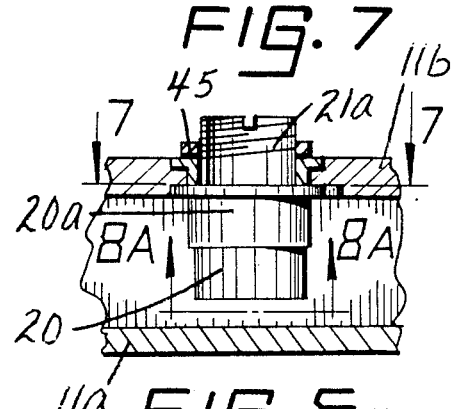

MECHANICAL ADJUSTMENT ARRANGEMENT FOR DIELECTRIC RESONATOR OSCILLATOR

As is known, importance lies in determining the resonant frequency of a high frequency dielectric resonator oscillator (DRO) which employs, for example, a dielectric resonator disc.

One approach to the preceding is the utilization of Gunn diodes and microwave transmitters mounted in various transmission line resonators, where, however, among other objections, the preceding presents poor temperature stability for one reason or another. The latter also involves expensive production costs since very close tolerances are required for the transmission line resonator parts and the semi-conductor device characteristics used therewith.

Commercially available dielectric resonator oscillators have advanced to the usage of a transistor, Gunn or Impatt diode oscillator locked to some resonant frequency by a disc of dielectric material. In this connection, contemporary dielectric resonator oscillators include the mounting of the usually cylindrically shaped disc resonator over microstrip circuitry to which the disc resonator is electromagnetically coupled.

In order to achieve optimum oscillator characteristics, the disc resonator must be located adjacent the transmission line to provide proper positive feedback and an impedance match to the circuitry and semi-conductor device. Extremely precise tolerances are a necessity for optimum results, whereby an important need exists for optimizing the operating characteristics of DRO's in production, while, at the same time, minimizing the worker's time for perfecting these characteristics.

A recent approach to the aforesaid need is disclosed and claimed in U.S. Pat. No. 4,591,806, granted May 27, 1986, to Havens, and entitled DIELECTRIC RESONATOR STABILIZER OSCILLATOR AND METHOD FOR OPTIMIZING THE OPERATING CHARACTERISTICS THEREOF.

The aforesaid patent teaches the use of means for mounting the dielectric disc resonator onto a cover for the housing of an oscillator which includes transmission line circuitry to which the dielectric disc resonator is electromagnetically coupled. The cover is movably mounted with respect to the oscillator housing and, hence, also moves the physical location of the dielectric disc resonator.

In this connection, oversized openings are provided in the cover to permit movement of the dielectric disc resonator in the X and Y coordinate directions during production, but with the serious drawback in achieving the same location in the event that cover removal and/or replacement becomes a necessity.

BRIEF SUMMARY OF THE INVENTION

The present invention further satisfies the aforesaid need, but in a more simple, reliable and duplicative result. With the invention, the dielectric resonator is mounted on an arrangement defined by two eccentric or off-center plate members sandwiching a support or base plate, each movable individually to allow the precise positioning of the dielectric resonator at any X and Y coordinate point in a given area. The aforesaid members are readily locked into a selected location and the support or base plate is readily removed and/or replaced without losing the selected X and Y coordinate point.

Briefly, the positioning of the eccentric rotatable members, one of which carries the off-center dielectric resonator, typically mounted on a dielectric spacer, is achieved by rotating the other of the members which presents an off-center opening. A centrally disposed stem on the disc resonator carrying member serves as a rotation axis, passing through the aforesaid off-center opening. Thus, the dielectric resonator is positionable at an optimum oscillator frequency capable of being readily duplicated.

BRIEF DESCRIPTION OF THE DRAWING

In any event, a better understanding of the present invention will become more apparent from the following description, taken in conjunction with the accompanying drawing, wherein FIG. 1 is a top plan view of a dielectric disc resonator adjustment arrangement for a DRO in accordance with the teachings of the present invention;

FIG. 2 is a view in side elevation, looking from right to left in FIG. 1;

FIG. 3 is a view in front elevation, partly broken away, detailing the instant adjustment arrangement;

FIG. 4 is a view of the DRO oscillator housing without the cover;

FIG. 5 is a fragmentary view in side elevation, similar to FIG. 3, but showing the instant adjustment arrangement at another position;

FIG. 6 is a top plan view, taken at line 6—6 on FIG. 3 and looking in the direction of the arrows, detailing an adjustment position thereof;

FIG. 7 is a top plan view, taken at line 7—7 on FIG. 5 and looking in the direction of the arrows, detailing another adjustment position thereof; and, FIGS. 8A, 8B and 8C, where FIG. 8A is taken at line 8A—8A of FIG. 5 and looking in the direction of the arrows and FIG. 8B is taken at line 8B—8B on FIG. 3 and looking in the direction of the arrows, show the relationship of the operative adjustment components in connection with the cover of the oscillator housing.

For the purposes of promoting an understanding of the principles of the invention, reference will now be made to the embodiment illustrated in the drawing and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to the figures, the dielectric resonator oscillator (DRO) on which the adjustment arrangement of the invention plays significance is, typically, characterized by a housing 11a overlaid by a cover or lid 11b selectively retained by threaded bolts 11c at each corner thereof. While apart from the invention, and, accordingly, not detailed herein, the aforesaid housing 11a presents microstrip circuitry on the bottom inside surface thereof defined, in part, by microstrip conductors 12a, 12b, 12c, 12d, 12e, and 12f arranged in a pattern interconnecting input 14, through which DC bias is applied, and outputs 15a and 15b, the latter selectively accommodating the usage and/or application of the oscillator.

The lid 11b includes an opening 11b' extending therethrough, where an inwardly directed rim 11b", at the mid-region of the lid 11b thickness, surrounds such. While opening 11b' has a constant diameter, the rim 11b" serves to present recessed areas for reasons evident herebelow.

Importantly, a dielectric resonator 20 (mounted on a dielectric spacer 20a) is secured onto a rotatable plate 21 received on one side of rim 11b" (see FIGS. 5 and 8A). The dielectric resonator 20 and dielectric spacer 20a are coaxial with respect to each other, but are eccentric or off-center with respect to the center of the rotatable plate 21. In any event, the rotatable plate 21 includes a centrally disposed threaded stem portion 21a, extending in an opposite direction to that of the dielectric resonator 20 and dielectric spacer 20a (again see FIG. 5).

Another rotatable plate 31 is received on the opposite side of the rim 11b" overlaying opening 11b' in cover 11b. The rotatable plate 31 includes an eccentric or off-set opening 31a through which the threaded stem portion 21a of plate 21 extends. A recess 31b in the plate 31 permits tool (not shown) entry for ready rotation thereof.

In other words, the needed adjustment is achieved by an arrangement employing two eccentrics, where such permit movement of the dielectric resonator to a desired X and Y coordinate. Restated otherwise, upon rotation of plate 21, the off-center dielectric resonator 20 is movable upon movement of the threaded stem portion 21a within the off-center opening 31a in the rotatable plate 31. Thus, the threaded stem portion 21a serves as a rotational axis for the dielectric resonator 20.

The X and Y coordinate location serves to optimize the oscillation characteristics of the DRO. When the desired adjustment has been achieved, a tightened locking nut 45, on the threaded stem portion 21a, operatively retains the selected location irrespective of any subsequent removal/replacement of the cover 11b. As a result, more selective and consistent frequency characteristics result.

As evident, and importantly, the invention overcomes a serious objection to the structures available heretofore, as that of U.S. Pat. No. 4,591,806, i.e. assures a repetitive oscillation frequency after an X and Y coordinate location has been established irrespective of any movement of the base (or cover 11b). The arrangement lends itself to production and, as should be understood, permits ease in frequency location with maximum latitude for a given area. In other words, the off-center relationships presented by the rotatable plates, i.e. the opening in one plate and the dielectric resonator disc in the other plate, assure a positive totaling effect in view of the location of the stem portion on the dielectric disc resonator carrying plate extending through the opening presented by the sandwiched base (or cover 11b).

The mechanical adjustment arrangement described hereabove is susceptible to various changes within the spirit of the invention, including, by way of example, in proportioning; the precise shape of the dielectric resonator; the particular combination of the arrangement with the oscillator circuitry; the manner of fabrication; and, the like. Thus, the preceding should be considered illustrative, and not as limiting the scope of the following claims:

I claim:

1. An arrangement for mechanically adjusting a dielectric resonator mounted on a base member in a control relationship with circuitry for an oscillator comprising an opening extending through said base member, a first member rotatably disposed on one side of said base member over said opening and presenting an off-center opening extending therethrough, a second member rotatably disposed on the other side of said base member over said opening and presenting an off-center dielectric resonator extending in one direction and a centrally disposed stem extending in an opposite direction and through said off-center opening in said first member, whereby said dielectric resonator is movable along both X and Y coordinates, and means securing said stem and said dielectric resonator at a selected X and Y coordinate location.

2. The arrangement of claim 1 where said stem serves as a rotational axis for said second member.

3. The arrangement of claim 1 where said selected position of said dielectric resonator remains fixed irrespective of any movement of said base member.

4. The arrangement of claim 1 where said base member is a cover overlying a cavity containing said oscillator circuitry.

5. The arrangement of claim 4 where said position of said dielectric resonator remains fixed irrespective of any movement of said cover.

6. The arrangement of claim 1 where said first member includes means selectively accomplishing the rotation thereof.

7. The arrangement of claim 6 where said means is a tool controlled recess.

8. An arrangement for mechanically adjusting a dielectric resonator mounted on a base member in a control relationship with circuitry for an oscillator comprising an opening extending through said base member and presenting an inwardly directed rim accessible from opposite sides of said base member, a first member rotatably disposed on one side of said rim and presenting an off-center opening extending therethrough, a second member rotatably disposed on the other side of said rim and presenting an off-center dielectric resonator extending in one direction and a centrally disposed stem extending in an opposite direction and through said off-center opening in said first member, whereby said dielectric resonator is movable along both X and Y coordinates, and means securing said stem and said dielectric resonator at a selected X and Y coordinate location.

* * * * *